(12) United States Patent  (10) Patent No.: US 8,433,266 B2
Tang et al.  (45) Date of Patent: Apr. 30, 2013

(54) POWER SUPPLY METHOD, APPARATUS, AND SYSTEM FOR A RADIO FREQUENCY POWER AMPLIFIER

(75) Inventors: Zhi Tang, Shenzhen (CN); Zhaozheng Hou, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 375 days.

(21) Appl. No.: 12/895,216

(22) Filed: Sep. 30, 2010

(65) Prior Publication Data

US 2011/0074467 A1    Mar. 31, 2011

(30) Foreign Application Priority Data

Sep. 30, 2009  (CN) .......................... 2009 1 0190598

(51) Int. Cl.
*H04B 1/04* (2006.01)
(52) U.S. Cl.
USPC ............................................ 455/127.1
(58) Field of Classification Search .......... 455/127.1, 455/127.2, 127.3, 127.4
See application file for complete search history.

(56) References Cited

U.S. PATENT DOCUMENTS

| | | | |
|---|---|---|---|
| 7,058,373 B2 * | 6/2006 | Grigore | 455/127.1 |
| 7,091,772 B2 * | 8/2006 | Friedel et al. | 330/10 |
| 2003/0045252 A1 | 3/2003 | Nam | |
| 2005/0064830 A1 | 3/2005 | Grigore | |
| 2008/0278136 A1 | 11/2008 | Murtojarvi | |
| 2009/0011728 A1 | 1/2009 | Kawamoto et al. | |
| 2009/0191826 A1 * | 7/2009 | Takinami et al. | 455/110 |

FOREIGN PATENT DOCUMENTS

| | | |
|---|---|---|
| CN | 1579046 A | 2/2005 |
| CN | 1879090 A | 12/2006 |
| CN | 1938929 A | 3/2007 |
| CN | 101136630 A | 3/2008 |
| WO | WO 03/020546 A1 | 3/2003 |
| WO | WO 2005/096481 A1 | 10/2005 |

OTHER PUBLICATIONS

European Search Report, European Application No. 10183599.9-1233, Applicant: Huawei Technologies Co., Ltd., Dated: Dec. 14, 2010, 7 pages.
European Office Action, European Application No. 10 183 599.9-1233, Applicant: Huawei Technologies Co., Ltd., Dated: Apr. 26, 2011, 5 pages.
Chinese Office Action and Translation received in Chinese Application No. 200910190598.4 mailed Aug. 2, 2012, 13 pages.

* cited by examiner

*Primary Examiner* — Blane J Jackson
(74) *Attorney, Agent, or Firm* — Slater & Matsil, L.L.P

(57) ABSTRACT

A power supply apparatus for a radio frequency power amplifier (RFPA) is provided, where the output end of a voltage controlled voltage source (VCVS) and the output ends of N current controlled current sources (CCCSs) are coupled in parallel to supply power to the RFPA. The apparatus further includes an $n^{th}$ sampling unit, configured to sample the sum of the output currents of the first (n−1) CCCSs and the VCVS to obtain an $n^{th}$ sampling signal; and an $n^{th}$ filtering unit, configured to filter the $n^{th}$ sampling signal according to a predefined $n^{th}$ passband and output the filtered $n^{th}$ sampling signal to an $n^{th}$ CCCS, thus controlling the output current of the $n^{th}$ CCCS. The $n^{th}$ passband is lower than an $(n-1)^{th}$ passband. The switching frequency of the $n^{th}$ CCCS is higher than the switching frequency of an $(n-1)^{th}$ CCCS. N is an integer greater than or equal to 2, and n is a positive integer smaller than or equal to N.

20 Claims, 12 Drawing Sheets

POWER SUPPLY METHOD, APPARATUS, AND SYSTEM FOR A RADIO FREQUENCY POWER AMPLIFIER

This application claims priority to Chinese Patent Application 200910190598.4, which was filed Sep. 30, 2009 and is incorporated herein by reference.

TECHNICAL FIELD

The present invention relates to the power supply field, and in particular, to a power supply method, an apparatus, and a system for a radio frequency power amplifier (RFPA).

BACKGROUND

Radio communications develop towards 3rd Generation (3G) and long term evolution (LTE) featuring high-speed and large-capacity data transmission. Thus, efficient data modulation and coding technologies such as quadrature phase shift keying (QPSK) and quadrature amplitude modulation (QAM) should be adopted to modulate the amplitude and phase of radio frequency (RF) carriers. In addition, the superposition of multiple carriers is performed. After the previous processing, RF signals often have a high peak to average power ratio (PAPR). For example, the PAPR of wideband code division multiple access (WCDMA) RF signals reaches over 6.5 dB. For the RF signals with a high PAPR, the efficiency is low if an RFPA is powered by a constant voltage source.

The efficiency can be improved significantly if the RFPA is powered by an envelope tracking (ET) power supply. The principle is: extracting an envelope signal from an RF signal, and adjusting the output voltage of the ET power supply with the envelope signal so that the RFPA works in a quasi-linear area close to a saturated area; and improving the efficiency of the RFPA significantly by using digital signal processing technologies such as digital pre-distortion. The bandwidth of an envelope signal is often over 1 MHz; therefore, the ET power supply should rapidly track the envelope signal, and high conversion efficiency is required.

The basic idea of a prior ET power supply for an RFPA is to divide a power supply into a linear power supply A and a switching power supply B, which are connected in parallel at the output ends to supply power to the RFPA. The linear power supply A outputs the power of the high frequency part, and the switching power supply B outputs the power of the low frequency part. The linear power supply A uses a closed voltage loop to track high frequency envelope signals and is a voltage controlled voltage source (VCVS). The switching power supply B uses a closed current loop to detect the output current of the linear power supply A and adjust the output current of the switching power supply B so that the output current of the linear power supply A is as low as possible. The switching power supply B is a current controlled current source (CCCS).

If the overall efficiency is expected to be high enough, the output power of the linear power supply A must be as low as possible and the output power of the switching power supply B must be as high as possible. The prerequisite is that the bandwidth of the switching power supply B is high enough and that sufficient power spectrums can be covered. Due to the limitations of factors such as power components in the actual design, there is a certain constraint between the output power, the switching frequency, and the efficiency. Currently, there is no independent switching power supply that can meet the conditions of high output power, high bandwidth, and high efficiency. Therefore, the overall efficiency in the prior art is not high.

SUMMARY OF THE INVENTION

Embodiments of the present invention provide a power supply method, an apparatus, and a system for an RFPA to improve the overall power supply efficiency of a system.

A power supply apparatus for an RFPA includes a VCVS and N CCCSs. The VCVS is configured to receive an RF signal. An output end of the VCVS is connected to output ends of the N CCCSs in parallel. The apparatus further includes N sampling units and N filtering units, wherein N is an integer greater than or equal to 2. The N sampling units and N filtering units include:

a first sampling unit, configured to sample the output current of the VCVS to obtain a first sampling signal;

a first filtering unit, configured to filter the first sampling signal obtained by the first sampling unit according to a predefined first passband and output the filtered first sampling signal to a first CCCS, thus controlling the output current of the first CCCS;

an $n^{th}$ sampling unit, configured to sample a sum of output currents of the first (n−1) CCCSs and the VCVS to obtain an $n^{th}$ sampling signal; and an $n^{th}$ filtering unit, configured to filter the $n^{th}$ sampling signal according to a predefined $n^{th}$ passband and output the filtered $n^{th}$ sampling signal to an $n^{th}$ CCCS, thus controlling an output current of the $n^{th}$ CCCS.

The $n^{th}$ passband of the $n^{th}$ filtering unit is lower than an $(n-1)^{th}$ passband of an $(n-1)^{th}$ filtering unit. A switching frequency of the $n^{th}$ CCCS is higher than a switching frequency of an $(n-1)^{th}$ CCCS. n are all integers greater than or equal to 2 and smaller than or equal to N.

A power supply apparatus for an RFPA includes a VCVS and N CCCSs. The VCVS is configured to receive an RF signal. An output end of the VCVS is connected to output ends of the N CCCSs in parallel. The apparatus further includes a sampling unit configured to sample an output current of the VCVS to obtain a sampling signal, and N filtering units, wherein N is an integer greater than or equal to 2. The N filtering units include:

a first filtering unit, configured to filter the sampling signal according to a predefined first passband and output the filtered sampling signal to a first CCCS, thus controlling an output current of the first CCCS; and an $n^{th}$ filtering unit, configured to filter the sampling signal according to a predefined $n^{th}$ passband and output the filtered sampling signal to an $n^{th}$ CCCS, thus controlling an output current of the $n^{th}$ CCCS.

The $n^{th}$ passband of the $n^{th}$ filtering unit is lower than an $(n-1)^{th}$ passband of an $(n-1)^{th}$ filtering unit. A switching frequency of the $n^{th}$ CCCS is higher than a switching frequency of an $(n-1)^{th}$ CCCS. n are all integers greater than or equal to 2 and smaller than or equal to N.

A power supply method for an RFPA is to connect an output end of a VCVS that receives an RF signal and the output ends of N CCCSs in parallel. N is an integer greater than or equal to 2. The method includes: sampling the output current of the VCVS to obtain a first sampling signal; and filtering the first sampling signal according to a predefined first passband and outputting the filtered first sampling signal to a first CCCS, thus controlling the output current of the first CCCS. The method further includes:

sampling a sum of output currents of the first (n−1) CCCSs and the VCVS to obtain an $n^{th}$ sampling signal, and filtering the $n^{th}$ sampling signal according to a predefined $n^{th}$ passband and outputting the filtered $n^{th}$ sampling signal to an $n^{th}$ CCCS, thus controlling an output current of the $n^{th}$ CCCS.

The $n^{th}$ passband is lower than an $(n-1)^{th}$ passband. A switching frequency of the $n^{th}$ CCCS is higher than a switching frequency of an $(n-1)^{th}$ CCCS. n are all integers greater than or equal to 2 and smaller than or equal to N.

Another power supply method for an RFPA is to connect an output end of a VCVS that receives an RF signal and output ends of N CCCSs in parallel. N is an integer greater than or equal to 2. The method includes sampling an output current of the VCVS to obtain a sampling signal, and filtering the sampling signal according to a predefined $n^{th}$ passband and outputting the filtered sampling signal to an $n^{th}$ CCCS, thus controlling an output current of the $n^{th}$ CCCS.

The $n^{th}$ passband is lower than an $(n-1)^{th}$ passband. A switching frequency of the $n^{th}$ CCCS is higher than a switching frequency of an $(n-1)^{th}$ CCCS. n are all positive integers smaller than or equal to N.

A power supply system for an RFPA includes the RFPA, an RF antenna, and the preceding power supply apparatus for the RFPA.

The power supply apparatus for the RFPA is configured to supply power to the RFPA. As the load of the power supply apparatus for the RFPA, the RFPA is configured to amplify input signals of the RFPA and output the amplified signals. The RF antenna is configured to transmit the output signals of the RFPA.

Through the preceding technical solution, the embodiments of the present invention combine a VCVS with at least two CCCSs to supply power to an RFPA, allocate bands through the band stage matching of each filtering unit to output signals at different bands, and use CCCSs at different switching frequencies to output the power at the corresponding bands according to the signals at different bands. According to a combination of multiple CCCSs, the conditions of high output power, high bandwidth, and high efficiency may be met. Therefore, in comparison with the prior art, the overall efficiency of the power supply is improved by using the present invention.

BRIEF DESCRIPTION OF THE DRAWINGS

To make the technical solution of the present invention clearer, the accompanying drawings for illustrating the embodiments of the present invention or the prior art are briefly described below. Apparently, the accompanying drawings are exemplary only, and persons having ordinary skills in the art can derive other drawings from such accompanying drawings without any creative effort.

DETAILED DESCRIPTION OF ILLUSTRATIVE EMBODIMENTS

The technical solution under the present invention is described below with reference to the accompanying drawings. Evidently, the embodiments described below are exemplary only, without covering all embodiments of the present invention. Additionally, all other embodiments, which can be derived by those skilled in the art from the embodiments given herein without any creative efforts, fall within the scope of the present invention.

Figure 1:
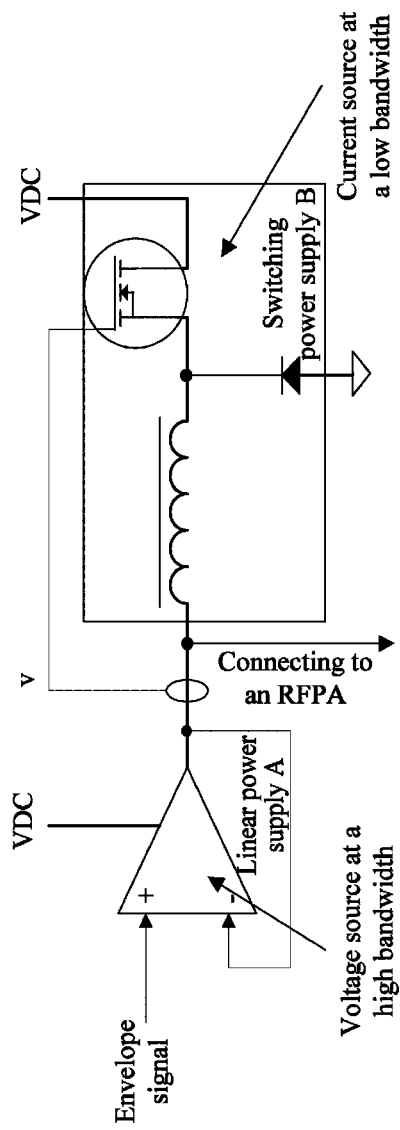
FIG. 1 shows a structure of an ET power supply for an RFPA in a prior art.

FIG. 1 shows a structure of an ET power supply for an RFPA in a prior art. As shown in FIG. 1, the power supply includes a linear power supply A and a switching power supply B. They are connected in parallel at the output ends to supply power to the RFPA. The linear power supply A outputs the power of the high frequency part, and the switching power supply B outputs the power of the low frequency part. The linear power supply A uses a closed voltage loop to track high frequency envelope signals and is a VCVS. The switching power supply B uses a closed current loop to detect the output current of the linear power supply A and adjust the output current of the switching power supply B so that the output current of the linear power supply A is as low as possible. The switching power supply B is a CCCS. In this paralleled structure, the linear power supply A is used to ensure that the output has a low distortion degree, and the switching power supply B is used to improve the overall efficiency.

Figure 2:
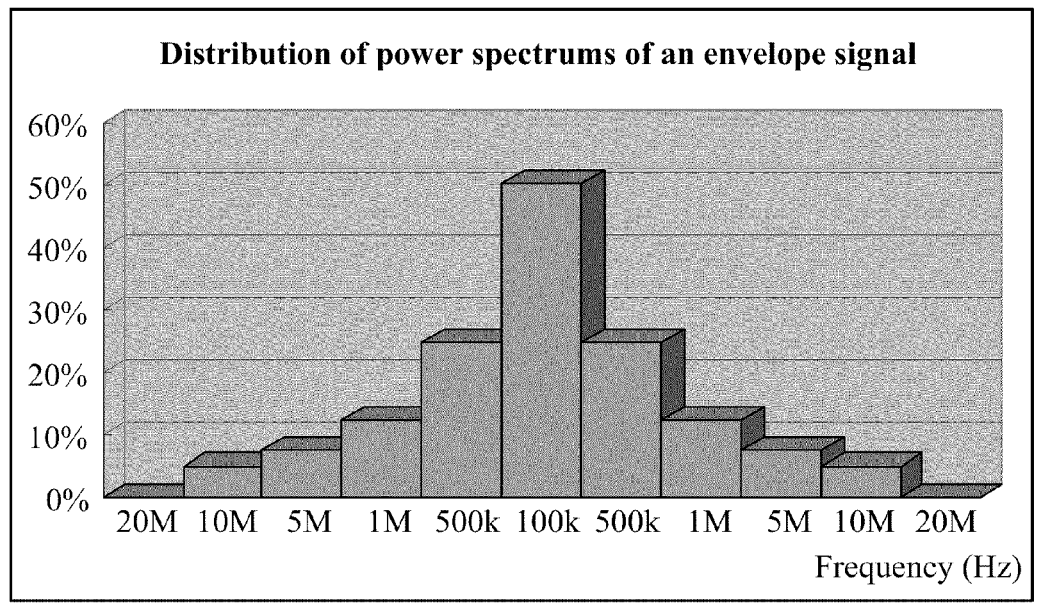
FIG. 2 shows power spectrum distribution of an RF envelope signal in an embodiment of the present invention.

FIG. 2 shows power spectrum distribution of an RF envelope signal in an embodiment of the present invention. The envelope signal may be a 3G envelope signal or an LTE RF envelope signal. As shown in FIG. 2, the bandwidth of the 3G envelope signal or LTE RF envelope signal is over 1 MHz. The power distribution has the following features: The power of the low frequency part is high and the power of the high frequency part is low. The power outputted to an RFPA is fixed. The prior experiments show that the efficiency of a VCVS is lower than the efficiency of a CCCS when the same power is outputted. Therefore, if the overall efficiency is expected to be high enough, the output power of the linear power supply A must be as low as possible and the output power of the switching power supply B must be as high as possible. The prerequisite is that the bandwidth of the switching power supply B is high enough and that sufficient power spectrums can be covered. This is because the switching power supply B cannot work normally if the bandwidth of the switching power supply B is not high enough. If the bandwidth of the switching power supply B is not enough, the switching power supply B cannot cover sufficient power spectrums, and accordingly, the provided power is limited. Therefore, it is expected to find a switching power supply B at the high output power, high bandwidth, and high efficiency.

With respect to an independent switching power supply, according to the Shannon-Nyquist sampling theorem, to improve a bandwidth, a switching frequency must be improved. The bandwidth of an envelope signal reaches over 1 MHz. During the actual design, due to the limitations of factors such as a power component, there is a certain constraint between the output power, the switching frequency, and the efficiency, as described in Table 1.

TABLE 1

Restriction relation between the output power, the switching frequency, and the efficiency

| | Output Power | Switching Frequency (Bandwidth) | Efficiency |
|---|---|---|---|
| Case 1 | High | High | Low |
| Case 2 | High | Low | High |
| Case 3 | Low | High | High |
| Case 4 | Low | Low | High |

According to the four cases in Table 1, an independent switching power supply that meets the high output power, high bandwidth, and high efficiency cannot be found. Therefore, the overall efficiency in the prior art is not high.

As shown in FIG. 2, the bandwidth of the 3G envelope signal or LTE RF envelope signal is over 1 MHz. The power distribution has the following features: the power of the low frequency part is high and the power of the high frequency part is low. In an embodiment of the present invention, the bandwidth of an envelope signal can be divided into multiple bands (number of bands ≧3). Assume that the bandwidth of an envelope signal is divided into three bands, namely, high band, intermediate band, and low band. The high band uses a linear power supply A at low power. The intermediate band uses a switching power supply B1 at low power and a high frequency (switching frequency of 1 MHz) (as described in case 3 in Table 1). The low band uses a switching power supply B2 at high power and a low frequency (switching frequency of several hundreds of kHz) (as described in case 2 in Table 1). Through a combination of the switching power supply B1 and the switching power supply B2, the three conditions of high output power, high bandwidth, and high efficiency can be met. In another embodiment of the present invention, the bandwidth of an envelope signal can be divided into four bands, five bands, seven bands, or eight bands. Accordingly, more switching power supplies are used. The bandwidth division and the number of switching power supplies are not limited.

As shown in FIG. 2, in an embodiment of the present invention, bands whose frequencies are higher than 10 MHz are classified as the high band, bands whose frequencies are between 1 MHz and 10 MHz are classified as the intermediate band, and other bands are classified as the low band. It can be understood that this is only one division method of the embodiment of the present invention. Assume that there are also three bands in other embodiments of the present invention. According to different division rules, the bandwidth of an envelope signal is divided into three bands, namely, high band, intermediate band, and low band.

The following further describes the technical solution provided in embodiments of the present invention with reference to accompanying drawings in detail.

Figure 3:
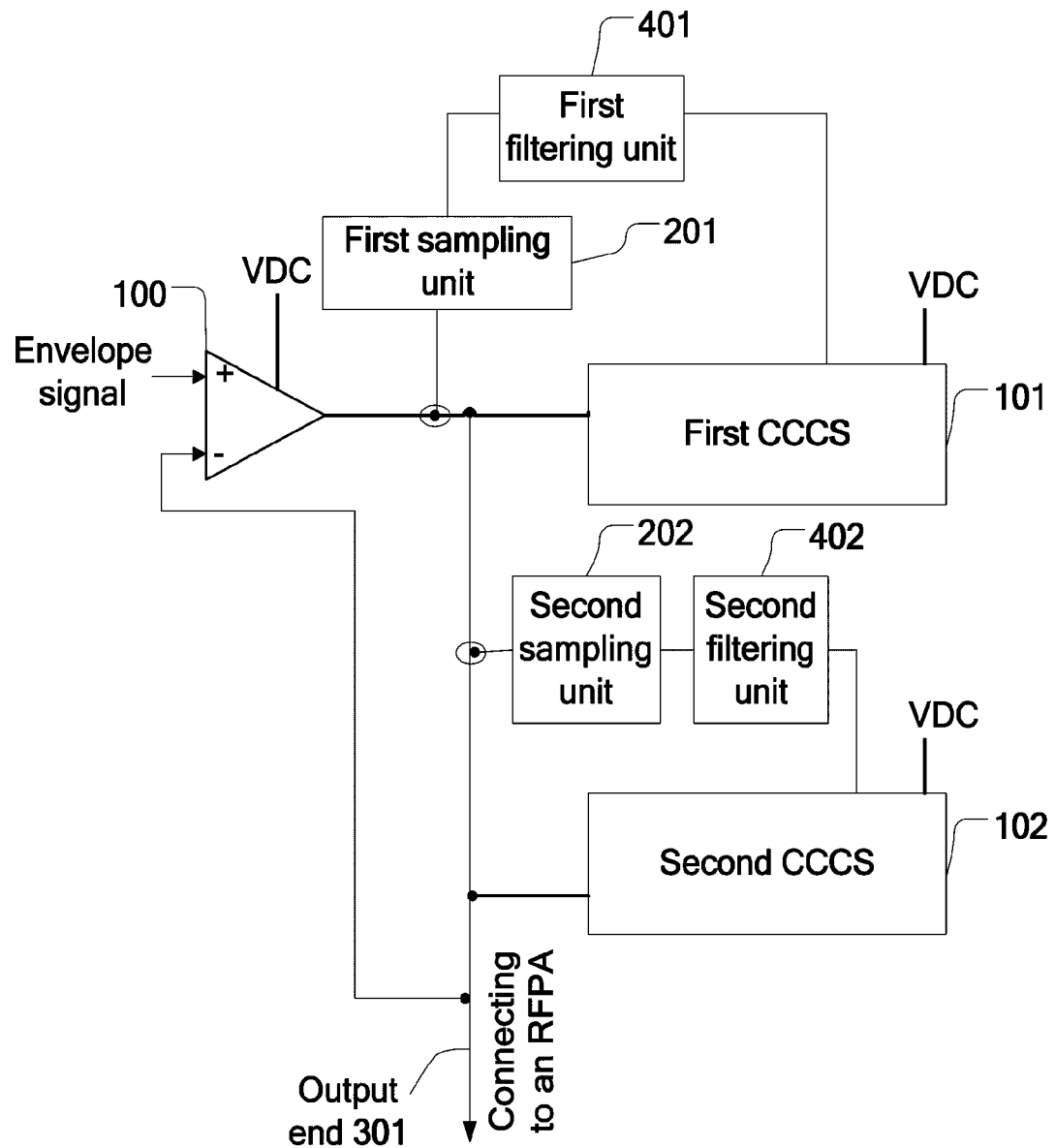
FIG. 3 shows a structure of a power supply apparatus for an RFPA in an embodiment of the present invention.

As shown in FIG. 3, a power supply apparatus for an RFPA in an embodiment of the present invention includes: a VCVS 100 and at least two CCCSs, namely, a first CCCS 101 and a second CCCS 102. The VCVS 100 is configured to receive an RF signal and track the envelope signal of the RF signal. The output end of the VCVS 100 is connected to the output ends of at least two CCCSs in parallel to supply power to the RFPA. The apparatus further includes:

a first sampling unit 201, configured to sample the output current of the VCVS 100 to obtain a first sampling signal;

a first filtering unit 401, configured to filter the first sampling signal obtained by the first sampling unit 201 according to a predefined first passband and output the filtered first sampling signal to the first CCCS 101, thus controlling the output current of the first CCCS 101;

a second sampling unit 202, configured to sample the sum of the output currents of the VCVS 100 and the first CCCS 101 to obtain a second sampling signal; and a second filtering unit 402, configured to filter the second sampling signal obtained by the second sampling unit 202 according to a predefined second passband and output the filtered second sampling signal to the second CCCS 102, thus controlling the output current of the second CCCS 102.

The first passband of the first filtering unit 401 is higher than the second passband of the second filtering unit 402.

In the embodiment of the present invention, the first filtering unit 401 is configured. The first CCCS 101 responds to only a high frequency sampling signal. The power of the high frequency signal is low; therefore, the first CCCS 101 needs to output only low power. Thus, a component at low power can be used, but the switching frequency can be very high (over several MHz). Therefore, the conditions of low power, high bandwidth, and high efficiency can be met.

In the embodiment of the present invention, the second filtering unit 402 is configured. The second CCCS 102 responds to only an intermediate frequency (IF) sampling signal. The power of the IF signal is moderate; therefore, the second CCCS 102 needs to output only intermediate power. Thus, a component at intermediate power can be used, but the switching frequency is high (about 1 MHz). Therefore, the conditions of intermediate power, intermediate bandwidth, and high efficiency can be met. Thus, the switching frequency of the first CCCS 101 is higher than the switching frequency of the second CCCS 102.

It should be noted that a sampling signal may be a current signal in an embodiment of the present invention and a voltage signal in another embodiment of the present invention, and the type of sampling signal is not limited in embodiments of the present invention.

It should be noted that a VCVS 100 can use a closed voltage loop to track the envelope signal of an RF signal in an embodiment of the present invention.

In an embodiment, a VCVS 100 is a linear VCVS, and one end of the VCVS 100 is connected to the output end 301 (namely, the load end) of an apparatus. That is, the output end 301 can return an output voltage of the output end to the VCVS 100 so that the VCVS 100 can compare the output voltage returned by the output end 301 with the envelope signal of the received RF signal, thus controlling the output voltage of the VCVS 100. According to the preceding technology, in comparison with an envelope signal, the distortion degree of an output voltage signal of the VCVS 100 is lower.

It should be noted that the VDC in FIG. 3 of an embodiment of the present invention is a DC voltage, which is configured to supply power to a voltage source and various current sources. In the following embodiments of the present invention, the meaning of VDC is the same.

In the embodiment of the present invention, through the preceding technical solution, one linear power supply (namely, a VCVS) and two switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high output power, high bandwidth, and high efficiency can be met. In comparison with the prior art, the overall efficiency is improved.

Figure 4:
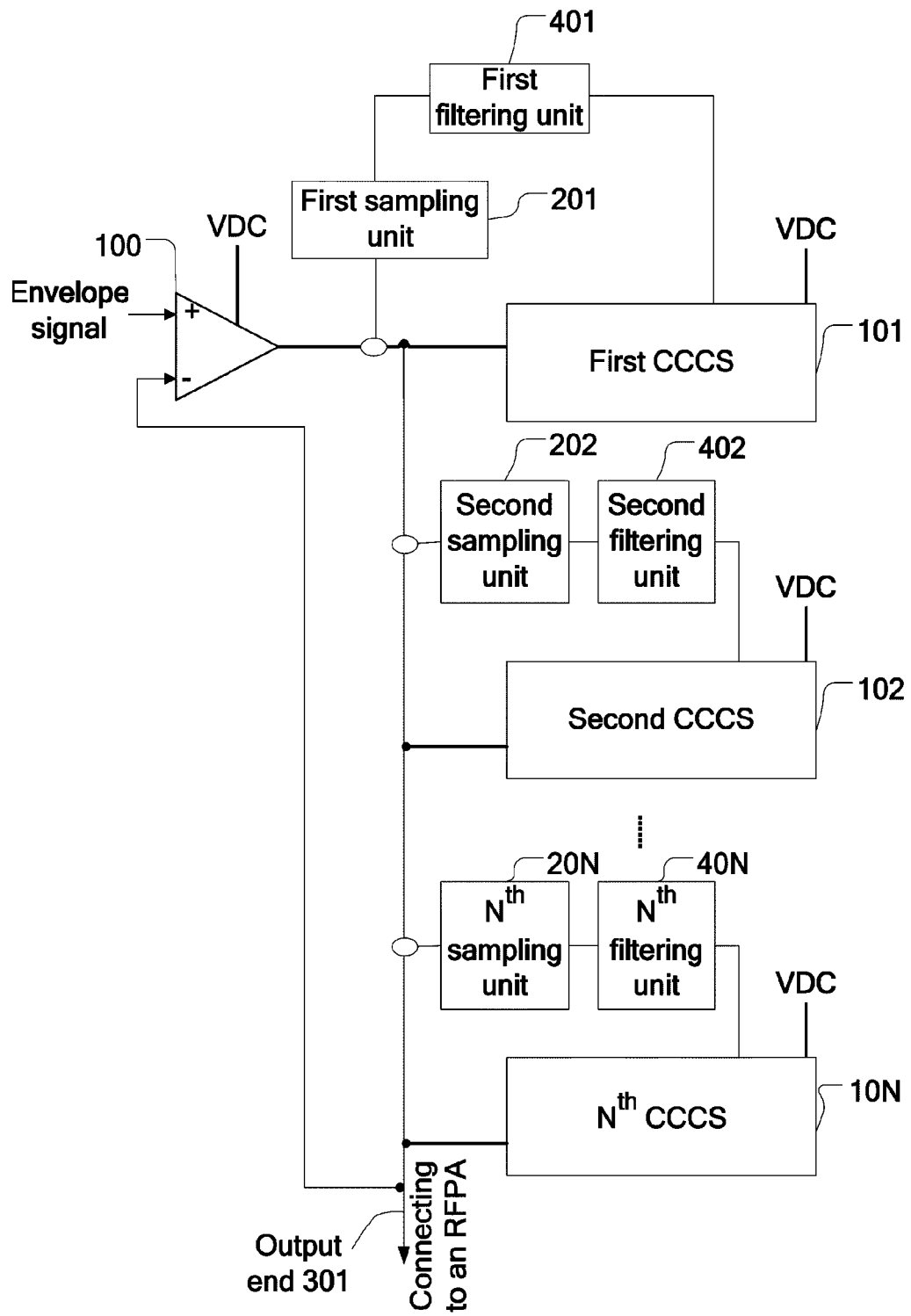
FIG. 4 shows a structure of a power supply apparatus for an RFPA in an embodiment of the present invention.

As shown in FIG. 4, a power supply apparatus for an RFPA provided in an embodiment of the present invention includes N CCCSs (CCCS 101 to CCCS 10N). N is an integer greater than or equal to 2. The apparatus includes an $n^{th}$ sampling unit 20$n$ and an $n^{th}$ filtering unit 40$n$.

The $n^{th}$ sampling unit 20$n$ is configured to sample the sum of the output currents of the first (n-1) CCCSs and a VCVS 100 to obtain an $n^{th}$ sampling signal.

That is, the $n^{th}$ sampling unit 20$n$ is configured to sample the sum of the output currents of the VCVS 100 and a first CCCS 101 to an $(n-1)^{th}$ CCCS (10$n$-1) to obtain the $n^{th}$ sampling signal.

It is well understood that when n is equal to 1, the $n^{th}$ sampling unit is the first sampling unit, and no sampling unit is in front of the first sampling unit because n-1=0. In this case, the first sampling unit samples only the output current of the VCVS 100. The second sampling unit samples the sum of the output currents of the VCVS 100 and the first CCCS.

The $n^{th}$ filtering unit 40$n$ is configured to filter the $n^{th}$ sampling signal obtained by the $n^{th}$ sampling unit 20$n$ according to a predefined $n^{th}$ passband and output the filtered $n^{th}$ sampling signal to an $n^{th}$ CCCS 10$n$, thus controlling the output current of the $n^{th}$ CCCS 10$n$.

The passbands of the first filtering unit 401 to the $N^{th}$ filtering unit 40N are arranged in high-to-low sequence. That is, the $n^{th}$ passband of the $n^{th}$ filtering unit is lower than the $(n-1)^{th}$ passband of the $(n-1)^{th}$ filtering unit.

The switching frequencies of the first CCCS 101 to the $N^{th}$ CCCS 10N are arranged in high-to-low sequence. That is, the switching frequency of the $n^{th}$ CCCS is higher than the switching frequency of the $(n-1)^{th}$ CCCS.

In the embodiment of the present invention, N is an integer greater than or equal to 2, and n are all positive integers smaller than or equal to N. That is, the $n^{th}$ CCCS 10$n$ is one of the N CCCSs. Accordingly, the $n^{th}$ sampling unit and the $n^{th}$ filtering unit are one of the N sampling units and one of the N filtering units respectively.

It should be noted that the preceding sampling signal may be a current signal in an embodiment of the present invention and a voltage signal in another embodiment of the present invention. The type of sampling signal is not limited in embodiments of the present invention.

In the embodiment of the present invention, various filtering units form a band allocation system of band stage matching so that various CCCSs work in different bands. The band stage matching is implemented by using CCCSs at different bandwidths, and the optimized configuration is performed for the output power and the bandwidth, thus supplying power to an RFPA.

It should be noted that in an embodiment of the present invention, in a band allocation system of band stage matching that includes multiple filtering units, the passband upper limit of each filtering unit may be set to a value that is slightly higher than the bandwidth upper limit of the corresponding CCCS, and the passband lower limit of each filtering unit may be set to a value that is slightly lower than the bandwidth upper limit of the next-level CCCS to ensure seamless band stage matching.

In the embodiment of the present invention, through the preceding technical solution, one linear power supply (namely, a VCVS) and at least two switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

Figure 5A:
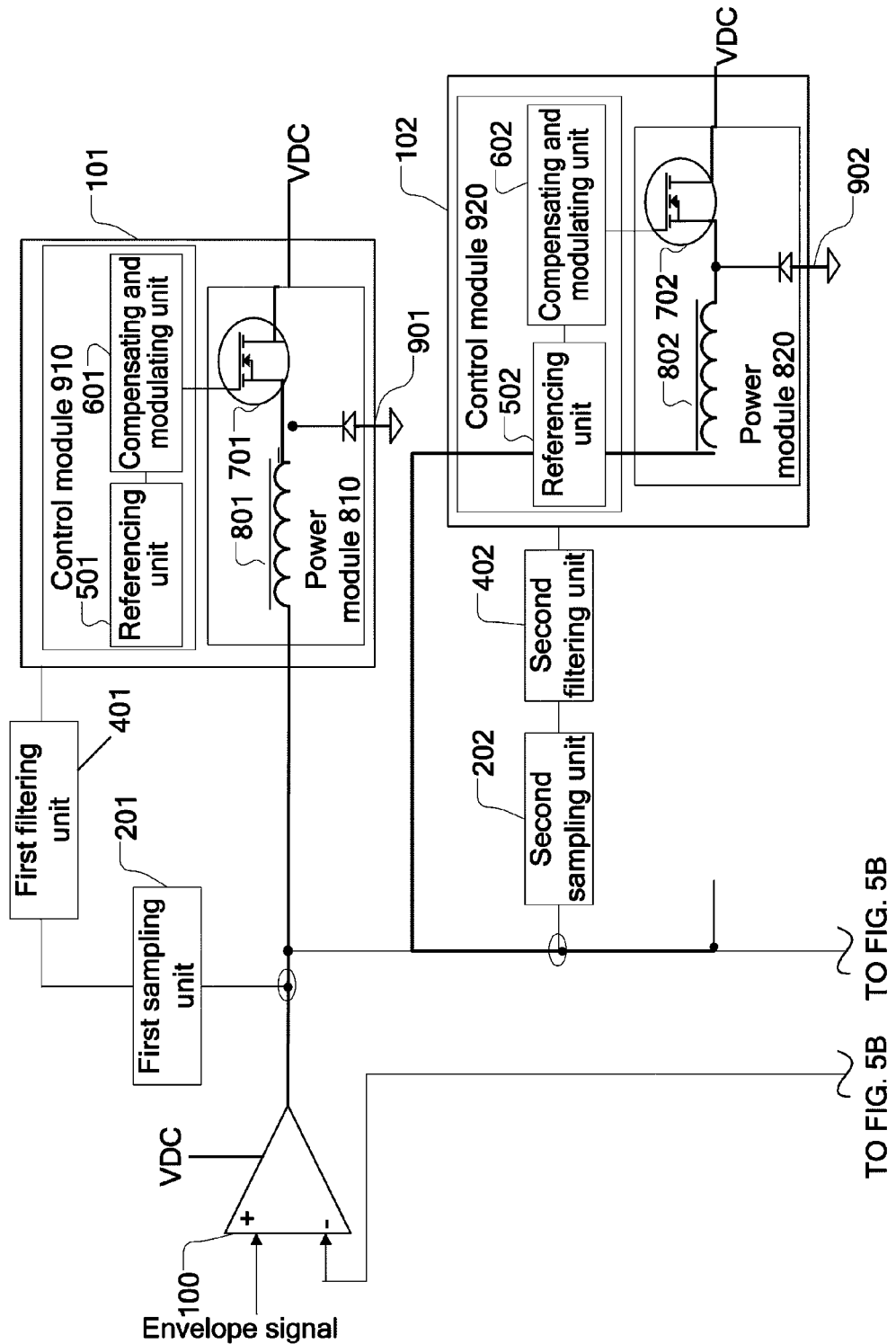
FIG. 5 shows a structure of a power supply apparatus for an RFPA in an embodiment of the present invention.
Figure 5B:
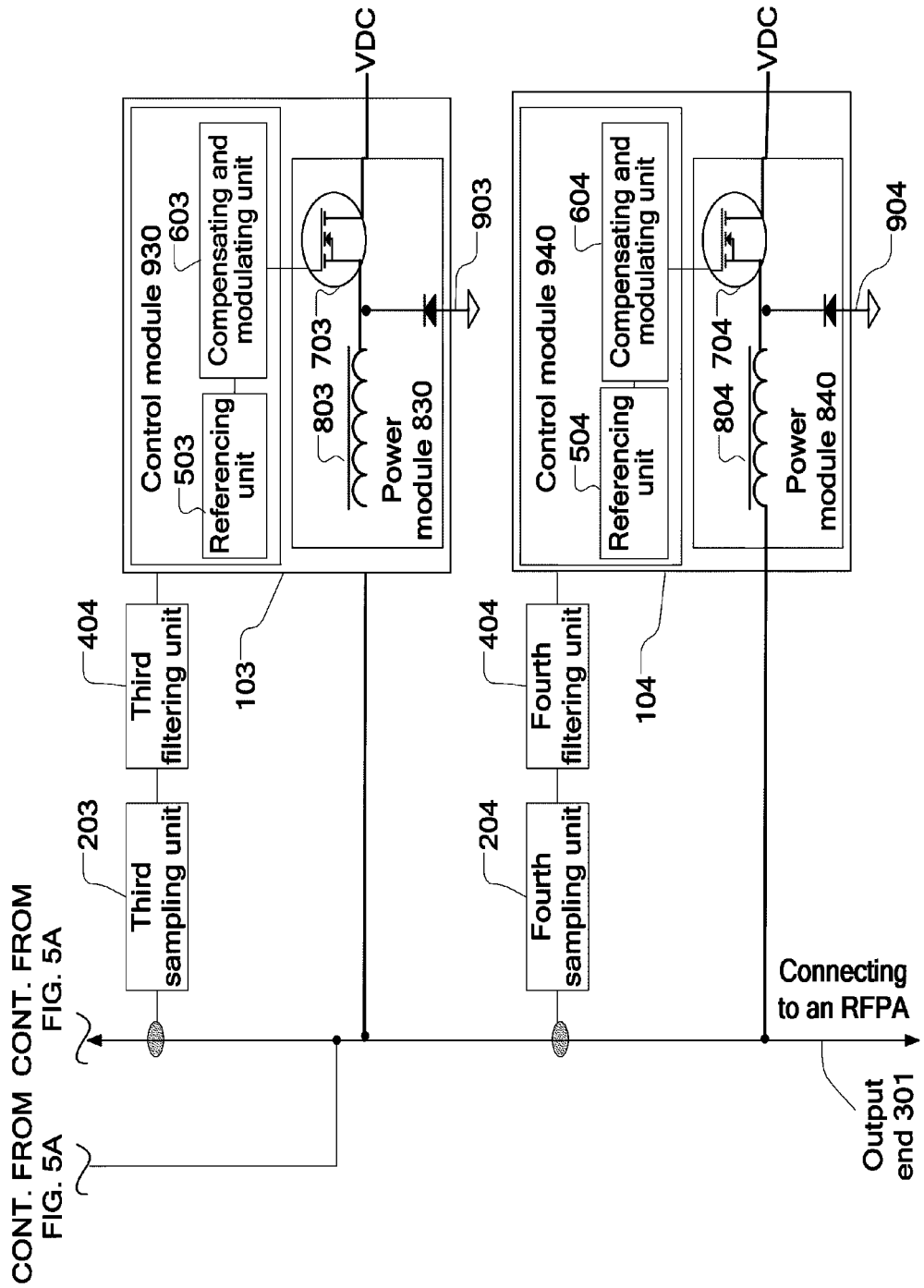

As shown in FIG. 5, a power supply apparatus for an RFPA in an embodiment of the present invention includes a VCVS 100, a first CCCS 101, a second CCCS 102, a third CCCS 103, and a fourth CCCS 104. The output ends of the VCVS 100, the first CCCS 101, the second CCCS 102, the third CCCS 103, and the fourth CCCS 104 are connected in parallel to supply power to the RFPA.

The VCVS 100 is configured to receive an RF signal and track the envelope signal of the RF signal.

In an embodiment of the present invention, a VCVS 100 can use a closed voltage loop to track the envelope signal of an RF signal.

In an embodiment of the present invention, a VCVS 100 is a linear VCVS, and one end of the VCVS 100 is connected to the output end 301 of an apparatus. That is, the output end 301 can return an output voltage of the output end to the VCVS 100 so that the VCVS 100 can compare the output voltage returned by the output end 301 with the envelope signal of the received RF signal, thus controlling the output voltage of the VCVS 100. According to the preceding technology, in comparison with an envelope signal, the distortion degree of an output voltage signal of the VCVS 100 is lower.

In an embodiment of the present invention, the bandwidth of an envelope signal can be divided into multiple bands (number of bands $\geq 3$). Assume that the bandwidth of an envelope signal is divided into three bands, namely, high band, intermediate band, and low band. The high band uses a VCVS 100. As shown in FIG. 2, a VCVS 100 is used at a band of over 10 MHz (namely, a high band). The power of the high frequency part is low, and in embodiments of the present invention, the output power of the VCVS 100 should be as low as possible. Therefore, the VCVS 100 is used at the high band.

A first sampling unit 201 is configured to sample the output current of the VCVS 100 to obtain a first sampling signal.

Specially, the sampling signal may be a current signal in one embodiment, a voltage signal in one embodiment, or a signal of another type in another embodiment. That is, the type of sampling signal is not limited in embodiments of the present invention.

Specifically, in an embodiment of the present invention, a current sensor may be used to sample the output current of a VCVS 100; and in another embodiment of the present invention, a probe may be used to sample the output current of a VCVS 100. That is, the sampling tool is not limited in embodiments of the present invention.

A first filtering unit 401 is configured to filter the first sampling signal obtained by the first sampling unit 201 according to a predefined high frequency filtering threshold (namely, a first passband) and output the filtered first sampling signal to the first CCCS 101, thus controlling the output current of the first CCCS 101.

As shown in FIG. 2, in an embodiment of the present invention, a high frequency filtering threshold may be preset to 10 MHz. Thus, after the first sampling signal of the first sampling unit 201 passes through the first filtering unit 401, only signals whose frequencies are over 10 MHz remain, and signals whose frequencies are lower than 10 MHz are filtered out by the first filtering unit 401. In an embodiment of the present invention, a first filtering unit 401 may be a high-pass filter at the central frequency of 10 MHz (that is, a high frequency filtering threshold is 10 MHz). It can be understood that a high frequency threshold can be set to another value such as 5 MHz, 20 MHz, or 15 MHz in another embodiment of the present invention. The high frequency threshold is not limited.

After filtering the current sampled by the first sampling unit 201, the first filtering unit 401 outputs the filtered first sampling signal to the first CCCS 101, thus controlling the output current of the first CCCS 101.

In an embodiment of the present invention, a first CCCS 101 may include a control module 910 and a power module 810.

After processing (enabling a signal to pass a comparer or an analogue-to-digital converter) the filtered sampling signal outputted by the first filtering unit 401, the control module 910 outputs a driving signal. The driving signal is used to control the power module 810 to output a proper current.

Controlling the output current of a CCCS according to a signal is a known technology in the art. The following describes the technology in brief.

As shown in FIG. 4, in an embodiment of the present invention, a first CCCS 101 is a current controlled switch current source (CCSCS) at a high bandwidth and low power. The first CCCS 101 may include a referencing unit 501, a compensating and modulating unit 601, a switching tube unit 701, an inductor 801, and a diode 901.

In an embodiment of the present invention, a control module 910 of a first CCCS 101 includes a referencing unit 501 and a compensating and modulating unit 601.

In an embodiment of the present invention, a power module 810 of a first CCCS 101 includes a switching tube unit 701, an inductor 801, and a diode 901. The three components form a BUCK converter to generate a current source.

After a sampling signal filtered by a first filtering unit 401 is outputted to the first CCCS 101, the sampling signal passes through the referencing unit 501 and is subtracted from a predefined reference, thus obtaining a difference signal.

Then, the compensating and modulating unit 601 compensates and modulates the difference signal to obtain a pulse signal. The pulse signal is configured to control the output current of the first CCCS 101.

Specifically, in an embodiment of the present invention, the compensating and modulating unit 601 performs proportional integration for the difference to amplify the difference signal (it is well understood that another amplification mode can be adopted in another embodiment to amplify the difference signal, such as an amplifier), and then performs loop compensation for the amplified difference signal so that the difference signal becomes stable.

The compensating and modulating unit 601 modulates the difference signal after the loop compensation to obtain a pulse signal. Specifically, the pulse signal can be obtained through pulse width modulation in one embodiment of the present invention; the pulse signal can be obtained through pulse spacing modulation in one embodiment of the present invention; and the pulse signal can be obtained through pulse position modulation in another embodiment of the present invention. The method for obtaining the pulse signal is not limited in embodiments of the present invention.

The pulse generated after modulation by the compensating and modulating unit 601 is configured to control a BUCK converter formed by the switching tube unit 701, the inductor 801, and the diode 901 to generate a current.

In an embodiment of the present invention, if the pulse width modulation mode is adopted, the generated pulses have widths. Accordingly, the wider a pulse is, the higher the current generated by the BUCK converter is.

In the embodiment of the present invention, the first filtering unit 401 is configured. The first CCCS 101 responds to only a high frequency current signal. The power of the high frequency signal is low; therefore, the first CCCS 101 needs to output only low power. Thus, a component at low power can be used, but the switching frequency can be very high (over several MHz). Therefore, the conditions of low power, high bandwidth, and high efficiency can be met.

It can be understood that the preceding describes only one special example, and a BUCK converter may have another form in another embodiment of the present invention. In another embodiment of the present invention, a Cuk converter or an isolation converter can replace a BUCK converter. The converter type is not limited in embodiments of the present invention.

A second sampling unit 202 is configured to sample the sum of the output currents of the VCVS 100 and the first CCCS 101 to obtain a second sampling signal.

A second filtering unit 402 is configured to filter the second sampling signal obtained by the second sampling unit 202 according to a predefined IF filtering threshold (that is, a second passband) and output the filtered second sampling signal to the second CCCS 102, thus controlling the output current of the second CCCS 102.

Similarly, as shown in FIG. 5, in an embodiment of the present invention, a second CCCS 102 may include a control module 920 and a power module 820.

In an embodiment of the present invention, a control module 920 of a second CCCS 102 includes a referencing unit 502 and a compensating and modulating unit 602.

In an embodiment of the present invention, a power module 820 of a second CCCS 102 includes a switching tube unit 702, an inductor 802, and a diode 902. The three components form a BUCK converter to generate a current source.

Specifically, the method for controlling the output current of the second CCCS 102 is similar to the method for controlling the output current of a first CCCS 101, and is not described here.

As shown in FIG. 2, in an embodiment of the present invention, an IF filtering threshold may be preset to a value between 1 MHz and 10 MHz. Thus, after a second sampling signal of a second sampling unit 202 passes through a second filtering unit 402, only signals whose frequencies are between 1 MHz and 10 MHz remain, and signals at other frequencies are filtered out by the second filtering unit 402. In an embodiment of the present invention, a second filtering unit 402 may be a band-pass filter at the cutoff frequency of 1 MHz and 10 MHz (that is, an IF filtering threshold is between 1 MHz and 10 MHz). It can be understood that the IF filtering threshold may be preset to another value in another embodiment of the present invention according to the actual situation. The IF filtering threshold is not limited.

In an embodiment of the present invention, a second CCCS 102 is a CCSCS at an intermediate bandwidth and intermediate power. In the embodiment of the present invention, a second filtering unit 402 is configured. The second CCCS 102 responds to only an IF sampling signal (the IF sampling signal may be a current signal in one embodiment of the present invention and a voltage signal in another embodiment of the present invention). The power of the IF signal is moderate; therefore, the second CCCS 102 needs to output only intermediate power. Thus, a component at intermediate power can be used, but the switching frequency is high (about 1 MHz). Therefore, the conditions of intermediate power, intermediate bandwidth, and high efficiency can be met.

A third sampling unit 203 is configured to sample the sum of the output currents of a VCVS 100, a first CCCS 101, and a second CCCS 102 to obtain a third sampling signal.

A third filtering unit 403 is configured to filter the third sampling signal obtained by the third sampling unit 203 according to a predefined low frequency and IF filtering threshold (namely, a third passband) and output the filtered third sampling signal to the third CCCS 103, thus controlling the output current of the third CCCS 103.

Similarly, as shown in FIG. 5, in an embodiment of the present invention, a third CCCS 103 may include a control module 930 and a power module 830.

In an embodiment of the present invention, a control module 930 of a third CCCS 103 includes a referencing unit 503 and a compensating and modulating unit 603.

In an embodiment of the present invention, a power module 830 of a third CCCS 103 includes a switching tube unit 703, an inductor 803, and a diode 903. The three components form a BUCK converter to generate a current source.

Specifically, the method for controlling the output current of the third CCCS 103 is similar to the method for controlling the output current of a first CCCS 101, and is not described here.

As shown in FIG. 2, in an embodiment of the present invention, a low and IF filtering threshold may be preset to a value between 500 kHz and 1 MHz. Thus, after a third sampling signal of a third sampling unit 203 passes through a third filtering unit 403, only sampling signals whose frequencies are between 500 kHz and 1 MHz remain, and sampling signals at other frequencies are filtered out by the third filtering unit 403. In an embodiment of the present invention, a third filtering unit 403 may be a band-pass filter at cutoff frequencies of 500 kHz and 1 MHz (that is, a low frequency and IF filtering threshold is between 500 kHz and 1 MHz). It can be understood that the low frequency and IF filtering threshold may be preset to another value in another embodiment of the present invention according to the actual situation. The low and IF filtering threshold is not limited.

In an embodiment of the present invention, a third CCCS 103 is a CCSCS at a low bandwidth and high power. In the embodiment of the present invention, the third filtering unit 403 is configured, and the third CCCS 103 responds to only a low frequency sampling signal. The power of the low frequency signal is high; therefore, the third CCCS 103 needs to output only high power, but the switching frequency can be low (lower than 1 MHz). Thus, a component at high power can be used, but the switching frequency is low (lower than 1 MHz). Therefore, the conditions of high power, low bandwidth, and high efficiency can be met.

A fourth sampling unit 204 is configured to sample the sum of the output currents of a VCVS 100, a first CCCS 101, a second CCCS 102, and a third CCCS 103 to obtain a fourth sampling signal.

A fourth filtering unit 404 is configured to filter the fourth sampling signal obtained by the fourth sampling unit 204 according to a predefined low frequency filtering threshold (namely, a fourth passband) and output the filtered fourth sampling signal to the fourth CCCS 104, thus controlling the output current of the fourth CCCS 104.

Similarly, as shown in FIG. 5, in an embodiment of the present invention, a fourth CCCS 104 may include a control module 940 and a power module 840.

In an embodiment of the present invention, a control module 940 of a fourth CCCS 104 includes a referencing unit 504 and a compensating and modulating unit 604.

In an embodiment of the present invention, a power module 840 of a fourth CCCS 104 includes a switching tube unit 704, an inductor 804, and a diode 904. The three components form a BUCK converter to generate a current source.

Specifically, the method for controlling the output current of the fourth CCCS 104 is similar to the method for controlling the output current of a first CCCS 101, and is not described here.

As shown in FIG. 2, in an embodiment of the present invention, a low frequency filtering threshold may be preset to 500 kHz. Thus, after a fourth sampling signal sampled by a fourth sampling unit 204 passes through a fourth filtering unit 404, only sampling signals whose frequencies are lower than 500 kHz remain, and sampling signals at other frequencies are filtered out by the fourth filtering unit 404. In an embodiment of the present invention, the fourth filtering unit 404 may be a low-pass filter at the central frequency of 500 kHz (that is, a low frequency filtering threshold is 500 kHz). It can be understood that the low frequency filtering threshold may be preset to another value in another embodiment of the present invention according to the actual situation. The low frequency filtering threshold is not limited.

In an embodiment of the present invention, a fourth CCCS 104 is a CCSCS at a low bandwidth and high power. In the embodiment of the present invention, the fourth filtering unit 404 is configured, and the fourth CCCS 104 responds to only a low frequency sampling signal. The power of the low frequency signal is high; therefore, the fourth CCCS 104 needs to output only high power, but the switching frequency can be low (several hundreds of kHz). Thus, a component at high power can be used, but the switching frequency is low (several hundreds of kHz). Therefore, the conditions of high power, low bandwidth, and high efficiency can be met.

It should be noted that the preceding sampling signal may be a current signal in an embodiment of the present invention and a voltage signal in another embodiment of the present invention. The type of sampling signal is not limited in embodiments of the present invention.

In the embodiment of the present invention, four filtering units form a band allocation system of band stage matching so that four CCCSs work in different bands; the band stage matching is implemented by using four CCCSs at different bandwidths, and the optimized configuration is performed for the output power and the bandwidth, thus supplying power to an RFPA.

It should be noted that in an embodiment of the present invention, in a band allocation system of band stage matching that includes multiple filtering units, the passband upper limit of each filtering unit may be set to a value that is slightly higher than the bandwidth upper limit of the corresponding CCCS, and the passband lower limit of each filtering unit may be set to a value that is slightly lower than the bandwidth upper limit of the next-level CCCS to ensure seamless band stage matching. For example, in an embodiment of the present invention, the bandwidths of a first CCCS 101 to a fourth CCCS 104 are 2 MHz, 1.5 MHz, 1 MHz, and 500 kHz respectively. Accordingly, the passbands of a first filtering unit 401 are 2.1 MHz to 1.4 MHz, the passbands of a second filtering unit 402 are 1.6 MHz to 0.9 MHz, the passbands of a third filtering unit 403 are 1.1 MHz to 0.4 MHz, and the passbands of a fourth filtering unit 404 are 0.6 MHz to 0 Hz.

To help those skilled in the art visually understand the technical effect of the present invention, the experiment results of the efficiency and output power by using one VCVS and four CCCSs are provided when the total output power is 40.3 W in an embodiment of the present invention, as described in Table 2.

TABLE 2

Efficiency and output power of each power supply in the prior art and in the embodiment of the present invention

|  | Output Power and Efficiency | Prior Art | Embodiment of the Present Invention |
| --- | --- | --- | --- |
| VCVS 100 | Output power (W) | 19.9 | 2 |
|  | Efficiency | 50% | 50% |
| First CCCS 101 | Output power (W) | 20.4 | 3 |
|  | Efficiency | 90% | 60% |
| Second CCCS 102 | Output power (W) | None | 5 |
|  | Efficiency | None | 70% |
| Third CCCS 103 | Output power (W) | None | 10 |
|  | Efficiency | None | 80% |
| Fourth CCCS 104 | Output power (W) | None | 20.3 |
|  | Efficiency | None | 90% |

According to the formula Efficiency=Output power/(Output power+Loss), the calculation formula for a loss is as follows: Loss=(Output power/Efficiency)−Output power. According to the formula Loss=(Output power/Efficiency)−Output power and the experiment data in Table 2, the loss (precise to one digit after the decimal point) of each power supply in the prior art and in the embodiment of the present invention can be calculated, as described in Table 3.

TABLE 3

Loss of each power supply in the prior art and in the embodiment of the present invention

| Power Supply | Loss (W) | Prior Art | Embodiment of the Present Invention |
| --- | --- | --- | --- |
| VCVS 100 | Loss | 19.9 | 2.0 |
| First CCCS 101 | Loss | 2.3 | 2.0 |
| Second CCCS 102 | Loss | None | 2.1 |
| Third CCCS 103 | Loss | None | 2.5 |
| Fourth CCCS 104 | Loss | None | 2.3 |
|  | Total loss | 22.2 | 10.9 |

According to Table 3, the total loss of the prior art is 22.2 W, and the total loss of the embodiment of the prior art is 10.9 W, which is about one half of the total loss of the prior art. The loss of the output power can be reduced to a great extent by adopting the technical solution in the embodiment of the present invention. Thus, the overall efficiency can be improved.

To help those skilled in the art visually understand the loss and the overall efficiency of the present invention, according to Table 3 and Table 2, comparison of the power, loss, and efficiency between the embodiment of the present invention and the prior art is provided, as described in Table 4.

According to Table 4, when the total output power is 40.3 W, the total efficiency of the power amplifier (PA) power supply in the prior art is 64.5%, and the total efficiency of the PA power supply in the embodiment of the present invention is 78.7%, which is improved to a great extent in comparison with the prior art.

TABLE 4

Total loss and efficiency of the power supply in the prior and in the embodiment of the present invention

| Power, Loss, and Efficiency | Prior Art | Embodiment of the Present Invention |
| --- | --- | --- |
| Total output power of the PA power supply (W) | 40.3 | 40.3 |
| Total input power of the PA power supply (W) | 62.5 | 51.2 |
| Total loss of the PA power supply (W) | 22.2 | 10.9 |
| Total efficiency of the PA power supply (%) | 64.5% | 78.7% |

In the embodiment of the present invention, through the preceding technical solution, one linear power supply (namely, a VCVS) and four switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

Figure 6:
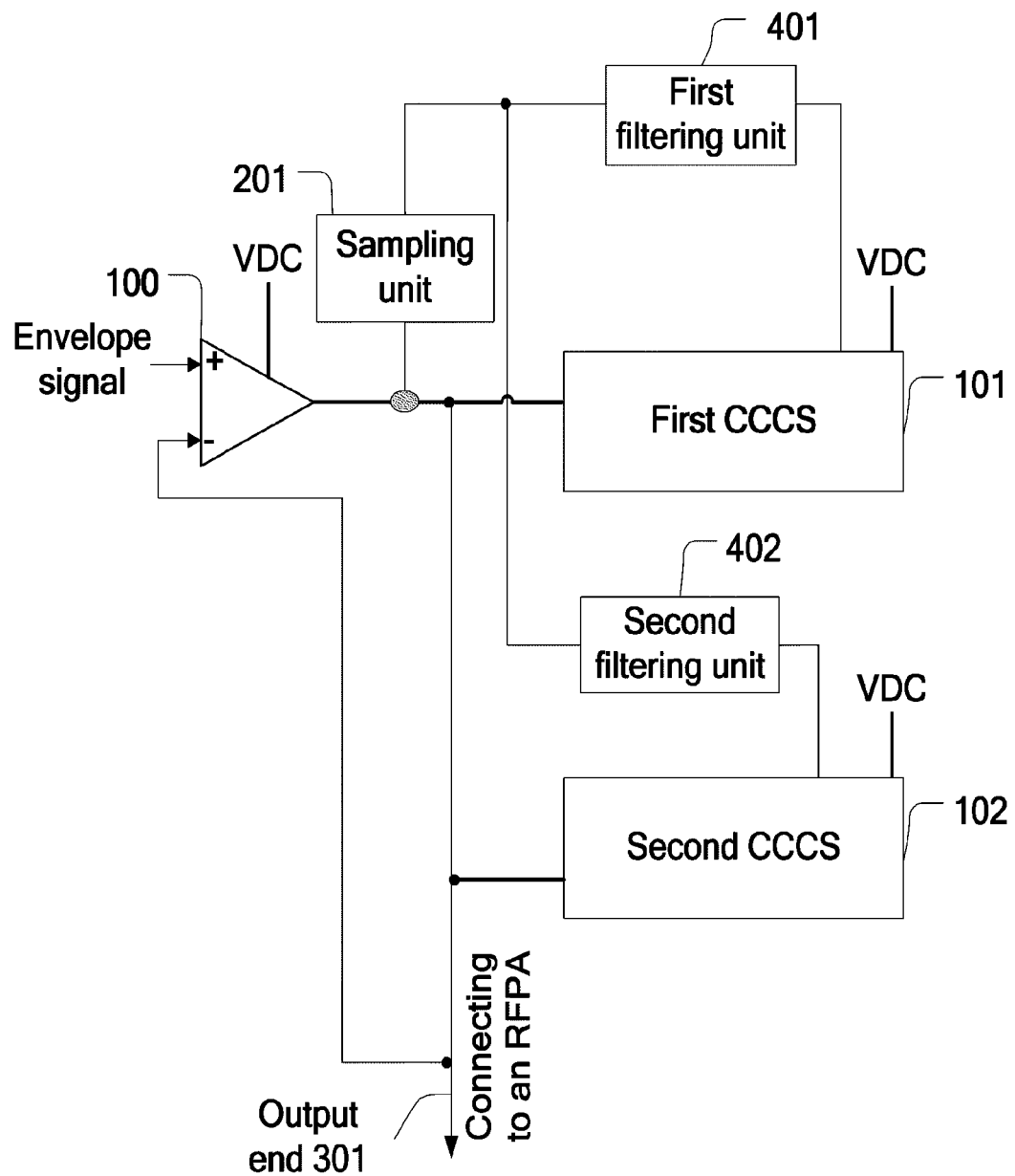
FIG. 6 shows a structure of a power supply apparatus for an RFPA in an embodiment of the present invention.

As shown in FIG. 6, a power supply apparatus for an RFPA is provided in an embodiment of the present invention. Different from the embodiment corresponding to FIG. 3, in the embodiment, the apparatus includes a sampling unit 201. Specifically, the apparatus includes a sampling unit 201, a first filtering unit 401, and a second filtering unit 402.

The sampling unit 201 is configured to sample the output current of a VCVS 100 to obtain a sampling signal.

The first filtering unit 401 is configured to filter the sampling signal obtained by the sampling unit 201 according to a predefined first passband and output the filtered sampling signal to the first CCCS 101, thus controlling the output current of the first CCCS 101.

The specific control method is described in the preceding embodiments and is not described here.

The second filtering unit 402 is configured to filter the sampling signal obtained by the sampling unit 201 according to a predefined second passband and output the filtered sampling signal to the second CCCS 102, thus controlling the output current of the second CCCS 102.

The specific control method is described in the preceding embodiments and is not described here.

The first passband of the first filtering unit 401 is higher than the second passband of the second filtering unit 402.

In an embodiment of the present invention, a first passband may be a high band threshold, and a second filtering unit may be an intermediate band threshold. The first filtering unit 401 is configured. The first CCCS 101 responds to only a high frequency sampling signal. The power of the high frequency sampling signal is low; therefore, the first CCCS 101 needs to output only low power. Thus, a component at low power can be used, but the switching frequency can be very high (over several MHz). Therefore, the conditions of low power, high bandwidth, and high efficiency can be met.

The second filtering unit 402 is configured. The second CCCS 102 responds to only an IF sampling signal. The power of the IF signal is moderate; therefore, the second CCCS 102 needs to output only intermediate power. Thus, a component at intermediate power can be used, but the switching frequency is high (about 1 MHz). Therefore, the conditions of intermediate power, intermediate bandwidth, and high efficiency can be met.

Thus, the switching frequency of the first CCCS 101 is higher than the switching frequency of the second CCCS 102.

It should be noted that the preceding sampling signal may be a current signal in an embodiment of the present invention and a voltage signal in another embodiment of the present invention. The type of sampling signal is not limited in embodiments of the present invention.

In the embodiment of the present invention, through the preceding technical solution, one linear power supply (namely, a VCVS) and two switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

Figure 7:
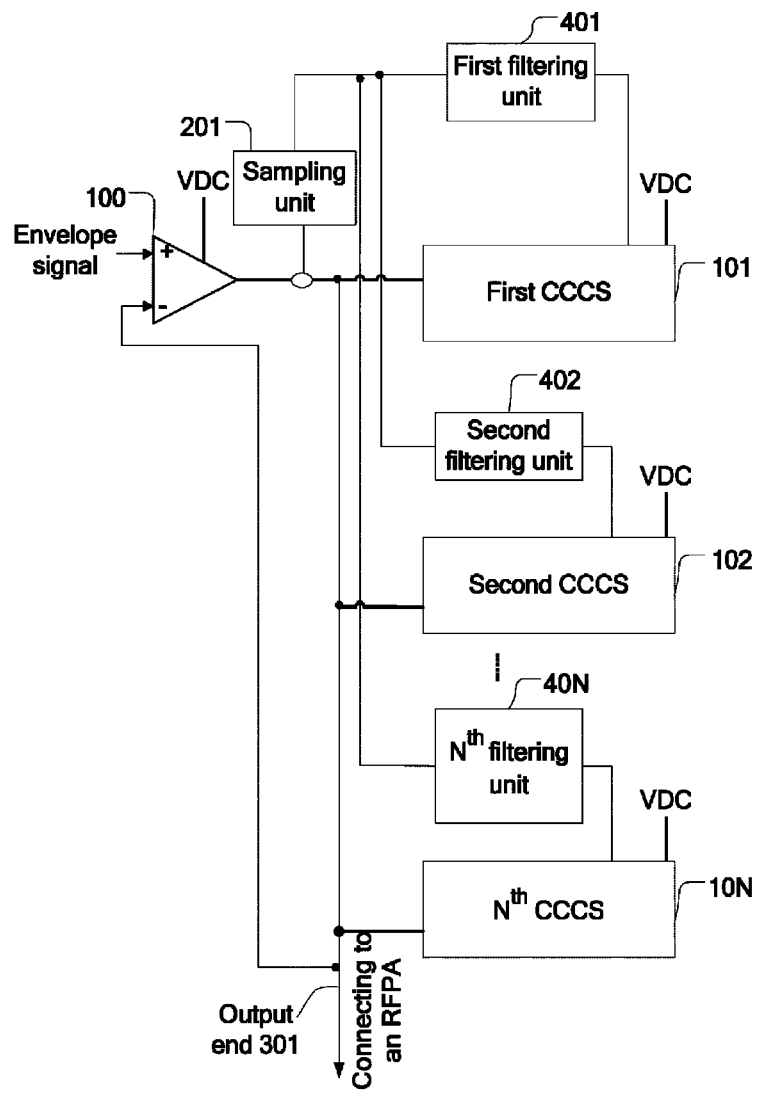
FIG. 7 shows a structure of a power supply apparatus for an RFPA in an embodiment of the present invention.

As shown in FIG. 7, a power supply apparatus for an RFPA provided in an embodiment of the present invention includes N CCCSs (CCCS 101 to CCCS 10N). N is an integer greater than or equal to 2. The apparatus includes:

a sampling unit 201, configured to sample the output current of a VCVS 100 to obtain a sampling signal; and an $n^{th}$ filtering unit 40n, configured to filter the sampling signal obtained by the sampling unit 201 according to a predefined $n^{th}$ passband and output the filtered sampling signal to an $n^{th}$ CCCS 10n, thus controlling the output current of the $n^{th}$ CCCS 10N.

The specific control method is described in the preceding embodiments and is not described here.

The passbands of the first filtering unit 401 to the $N^{th}$ filtering unit 40N are arranged in high-to-low sequence. That is, the $n^{th}$ passband of the $n^{th}$ filtering unit is lower than the $(n-1)^{th}$ passband of the $(n-1)^{th}$ filtering unit.

The switching frequencies of the first CCCS 101 to the $N^{th}$ CCCS 10N are arranged in high-to-low sequence. That is, the switching frequency of the $n^{th}$ CCCS is higher than the switching frequency of the $(n-1)^{th}$ CCCS.

In the embodiment of the present invention, N is an integer greater than or equal to 2, and n are all positive integers smaller than or equal to N. That is, the $n^{th}$ CCCS 10n is one of the N CCCSs. Accordingly, the $n^{th}$ filtering unit is one of N filtering units.

It should be noted that the preceding sampling signal may be a current signal in an embodiment of the present invention and a voltage signal in another embodiment of the present invention. The type of sampling signal is not limited in embodiments of the present invention.

In the embodiment of the present invention, various filtering units form a band allocation system of band stage matching so that various CCCSs work in different bands; the band stage matching is implemented by using multiple CCCSs at different bandwidths, and the optimized configuration is performed for the output power and the bandwidth, thus supplying power to an RFPA.

It should be noted that in an embodiment of the present invention, in a band allocation system of band stage matching that includes multiple filtering units, the passband upper limit of each filtering unit may be set to a value that is slightly higher than the bandwidth upper limit of the corresponding CCCS, and the passband lower limit of each filtering unit may be set to a value that is slightly lower than the bandwidth upper limit of the next-level CCCS to ensure seamless band stage matching.

In the embodiment of the present invention, through the preceding technical solution, one linear power supply (namely, a VCVS) and at least two switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

Figure 8:
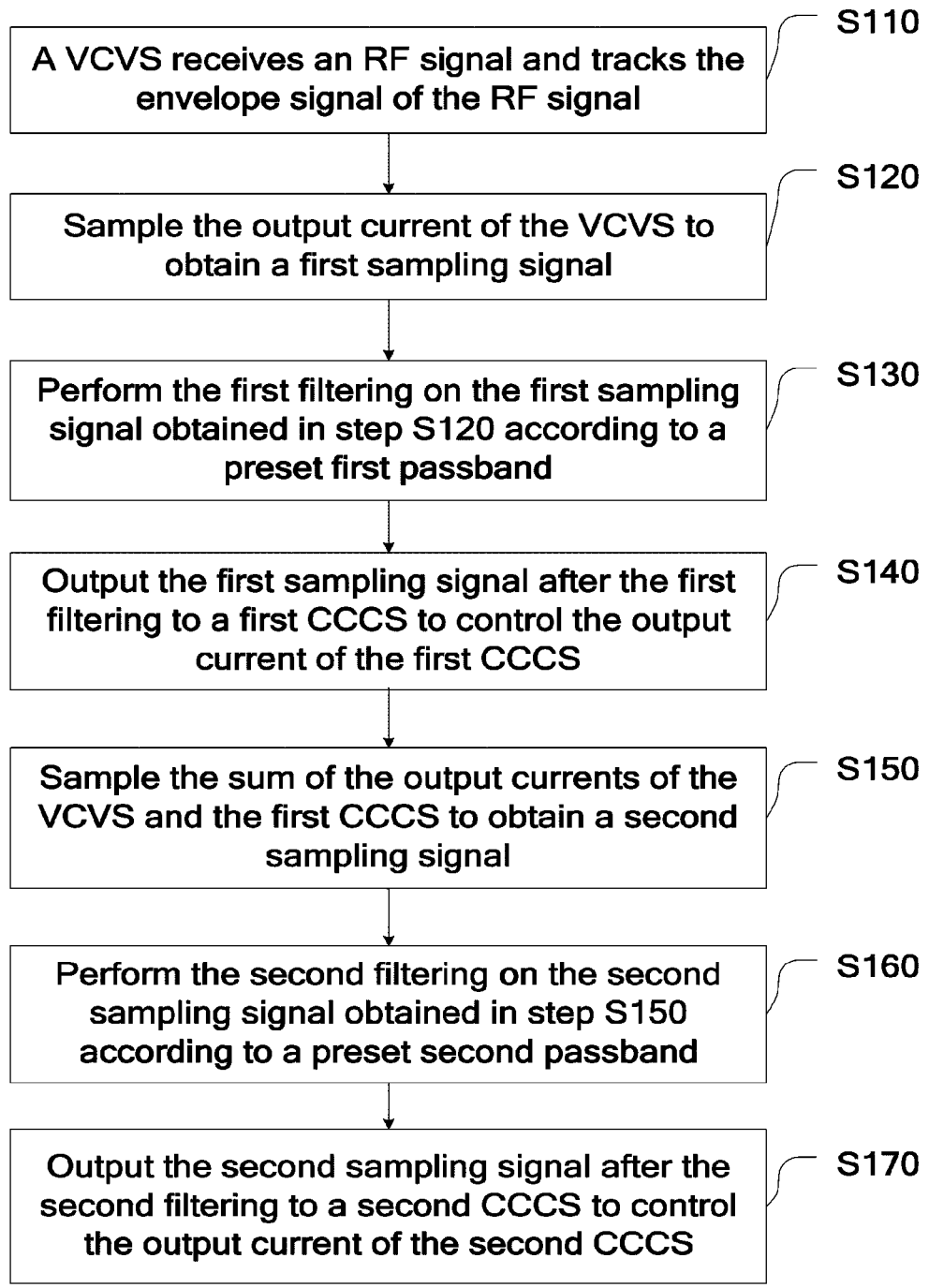
FIG. 8 is a flowchart of a power supply method for an RFPA in an embodiment of the present invention.

As shown in FIG. 8, accordingly, an embodiment of the present invention provides a power supply method for an RFPA. The output end of a VCVS and the output ends of two CCCSs are connected in parallel to supply power to the RFPA. The method includes the following steps:

S110, The VCVS receives an RF signal and tracks the envelope signal of the RF signal.

In an embodiment of the present invention, a VCVS can use a closed voltage loop to track the envelope signal of an RF signal.

In an embodiment of the present invention, a VCVS is a linear VCVS, and one end of the VCVS is connected to the output end of a system. The output end returns an output voltage to the VCVS so that the VCVS can compare the output voltage returned by the output end with the envelope signal of the received RF signal, thus controlling the output voltage of the VCVS. According to the preceding technology, in comparison with an envelope signal, the distortion degree of an output voltage signal of the VCVS is lower.

S120, Sample the output current of the VCVS to obtain a first sampling signal.

Specifically, in an embodiment of the present invention, a current sensor may be used to sample the output current of a VCVS; and in another embodiment of the present invention, a probe may be used to sample the output current of a VCVS. That is, the sampling tool is not limited in embodiments of the present invention.

Specially, the sampling signal may be a current signal in one embodiment, a voltage signal in one embodiment, or a signal of another type in another embodiment. That is, the type of sampling signal is not limited in embodiments of the present invention.

S130, Perform the first filtering on the first sampling signal obtained in step S120 according to a predefined first passband.

The specific filtering situation is described in the preceding embodiments and is not described here.

S140, Output the first sampling signal after the first filtering to a first CCCS to control the output current of the first CCCS.

S150, Sample the sum of the output currents of the VCVS and the first CCCS to obtain a second sampling signal.

S160, Perform the second filtering on the second sampling signal obtained in step S150 according to a predefined second passband.

S170, Output the second sampling signal after the second filtering to a second CCCS to control the output current of the second CCCS.

It should be noted that the first passband is higher than the second passband and the switching frequency of the first CCCS is higher than the switching frequency of the second CCCS.

In the embodiment of the present invention, through the preceding technical solution, one linear power supply (namely, a VCVS) and two switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

Figure 9:
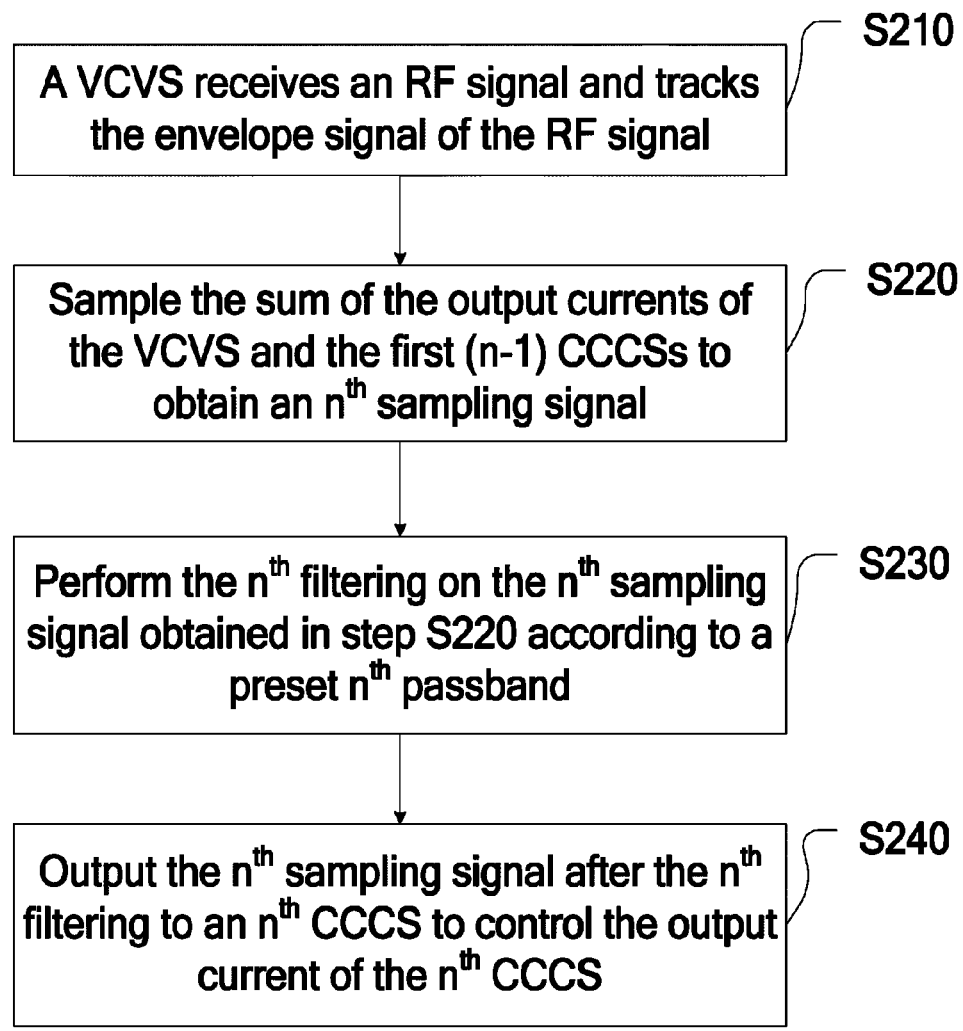
FIG. 9 is a flowchart of a power supply method for an RFPA in an embodiment of the present invention.

As shown in FIG. 9, accordingly, an embodiment of the present invention provides a power supply method for an RFPA. The output end of a VCVS and the output ends of N CCCSs are connected in parallel to supply power to the RFPA. N is an integer greater than or equal to 2. The method includes the following steps:

S210: The VCVS receives an RF signal and tracks the envelope signal of the RF signal.

In an embodiment of the present invention, a VCVS can use a closed voltage loop to track the envelope signal of an RF signal.

In an embodiment of the present invention, a VCVS is a linear VCVS, and one end of the VCVS is connected to the output end of a system. The output end feeds back an output voltage to the VCVS so that the VCVS can compare the output voltage fed back by the output end with the envelope signal of the received RF signal, thus controlling the output voltage of the VCVS. According to the preceding technology, in comparison with an envelope signal, the distortion degree of an output voltage signal of the VCVS is lower.

S220: Sample the sum of the output currents of the VCVS and the first (n−1) CCCSs to obtain an $n^{th}$ sampling signal.

Specifically, in an embodiment of the present invention, a current sensor may be used to sample the sum of the output currents of a VCVS and a first CCCS to an $(n-1)^{th}$ CCCS; and in another embodiment of the present invention, a probe may be used to sample the sum of the output currents of a VCVS and a first CCCS to an $(n-1)^{th}$ CCCS. That is, the sampling tool is not limited in embodiments of the present invention.

S230: Perform the $n^{th}$ filtering on the $n^{th}$ sampling signal obtained in step S220 according to a predefined $n^{th}$ passband.

S240: Output the $n^{th}$ sampling signal after the $n^{th}$ filtering to an $n^{th}$ CCCS to control the output current of the $n^{th}$ CCCS.

It should be noted that the $n^{th}$ passband is lower than the $(n-1)^{th}$ passband. Specifically, in an embodiment of the present invention, N sampling units may be used to sample sampling signals and N filtering units may be used to filter the sampling signals sampled by the N sampling units. Thus, the passbands of the first filtering unit to the $N^{th}$ filtering unit are arranged in high-to-low sequence.

The switching frequency of the $n^{th}$ CCCS is higher than the switching frequency of the $(n-1)^{th}$ CCCS. That is, the switching frequencies of the first CCCS to the $N^{th}$ CCCS are arranged in high-to-low sequence.

In the embodiment of the present invention, N is an integer greater than or equal to 2, and n is a positive integer smaller than or equal to N.

In the embodiment of the present invention, various filtering units form a band allocation system of band stage matching so that various CCCSs work in different bands; the band stage matching is implemented by using multiple CCCSs at different bandwidths, and the optimized configuration is performed for the output power and the bandwidth, thus supplying power to an RFPA.

It should be noted that in an embodiment of the present invention, in a band allocation system of band stage matching that includes multiple filtering units, the passband upper limit of each filtering unit may be set to a value that is slightly higher than the bandwidth upper limit of the corresponding CCCS, and the passband lower limit of each filtering unit may be set to a value that is slightly lower than the bandwidth upper limit of the next-level CCCS to ensure seamless band stage matching.

In the embodiment of the present invention, through the preceding technical solution, one linear power supply (namely, a VCVS) and at least two switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

Figure 10:
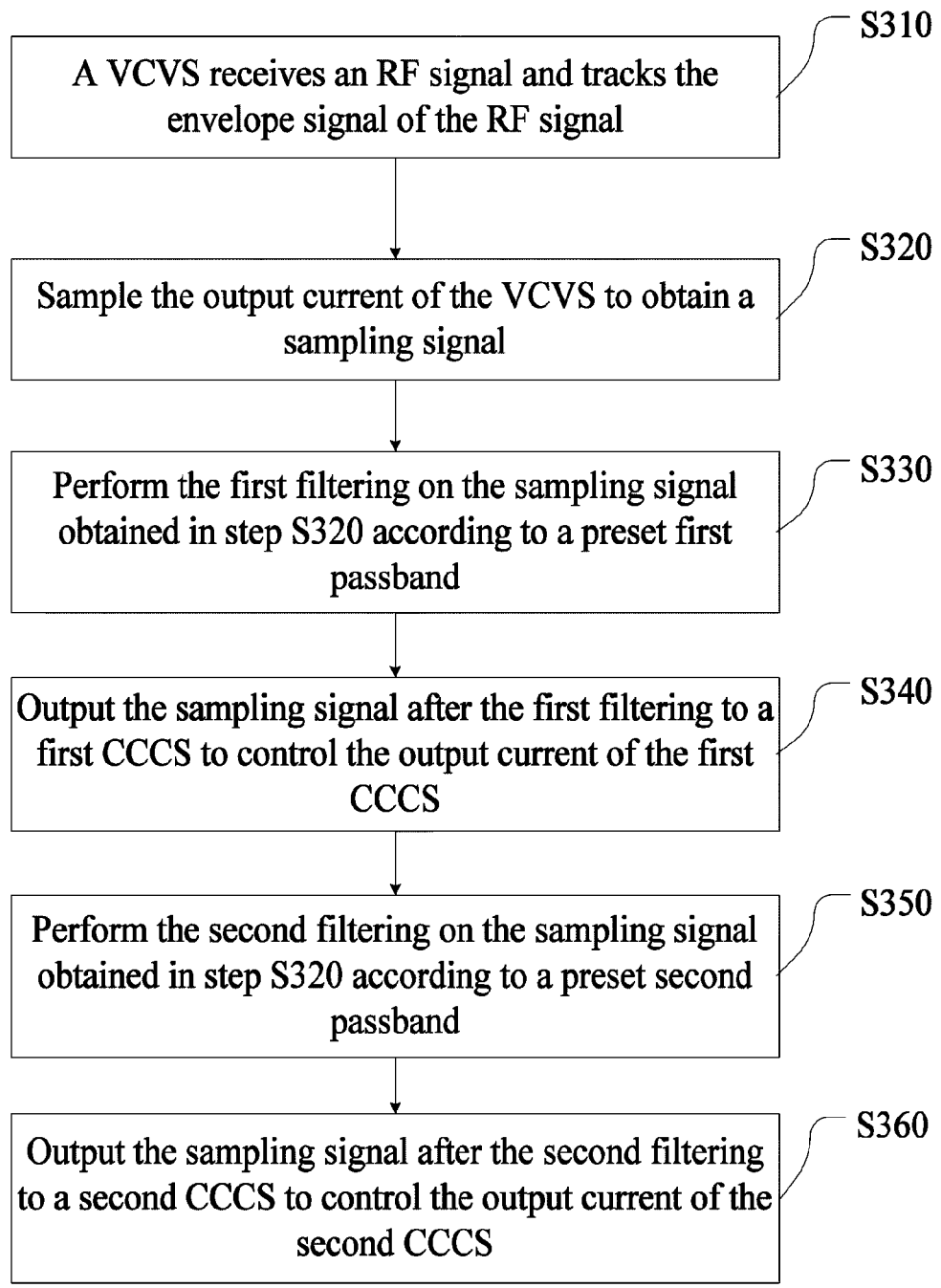
FIG. 10 is a flowchart of a power supply method for an RFPA in an embodiment of the present invention.

As shown in FIG. 10, an embodiment of the present invention provides a power supply method for an RFPA. The output end of a VCVS and the output ends of two CCCSs are connected in parallel to supply power to the RFPA. The method embodiment of the present invention detects only the output current of the VCVS. The method includes the following steps:

S310: The VCVS receives an RF signal and tracks the envelope signal of the RF signal.

In an embodiment of the present invention, a VCVS can use a closed voltage loop to track the envelope signal of an RF signal.

In an embodiment of the present invention, a VCVS is a linear VCVS, and one end of the VCVS is connected to the output end of a system. The output end feeds back an output voltage to the VCVS so that the VCVS can compare the output voltage fed back by the output end with the envelope signal of the received RF signal, thus controlling the output voltage of the VCVS. According to the preceding technology, in comparison with an envelope signal, the distortion degree of an output voltage signal of the VCVS is lower.

S320: Sample the output current of the VCVS to obtain a sampling signal.

Specifically, in an embodiment of the present invention, a current sensor may be used to sample the output current of a VCVS; and in another embodiment of the present invention, a probe may be used to sample the output current of a VCVS. That is, the sampling tool is not limited in embodiments of the present invention.

Specially, the sampling signal may be a current signal in one embodiment, a voltage signal in one embodiment, or a signal of another type in another embodiment. That is, the type of sampling signal is not limited in embodiments of the present invention.

S330: Perform the first filtering on the sampling signal obtained in step S320 according to a predefined first passband.

S340: Output the sampling signal after the first filtering to a first CCCS to control the output current of the first CCCS.

S350: Perform the second filtering on the sampling signal obtained in step S320 according to a predefined second passband.

S360: Output the sampling signal after the second filtering to a second CCCS to control the output current of the second CCCS.

It should be noted that the first passband is lower than the second passband and the switching frequency of the first CCCS is higher than the switching frequency of the second CCCS.

In the embodiment of the present invention, through the preceding technical solution, one linear power supply (namely, a VCVS) and at least two switching power supplies (namely, CCCSs) are combined to supply power to an RFPA.

The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

Figure 11:
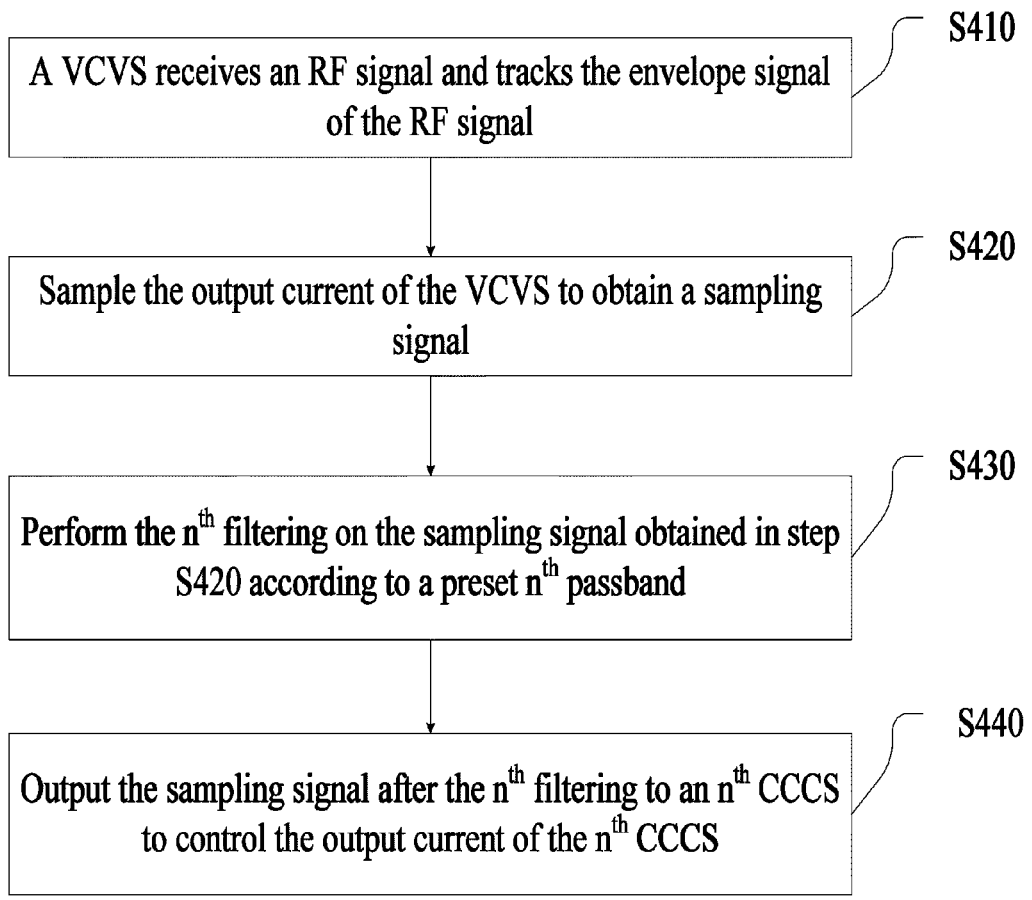
FIG. 11 is a flowchart of a power supply method for an RFPA in an embodiment of the present invention.

As shown in FIG. 11, an embodiment of the present invention provides a power supply method for an RFPA. The output end of a VCVS and the output ends of N CCCSs are connected in parallel to supply power to the RFPA. The method embodiment of the present invention detects only the output current of the VCVS. N is an integer greater than or equal to 2. The method includes the following steps:

S410: The VCVS receives an RF signal and tracks the envelope signal of an RF signal.

In an embodiment of the present invention, a VCVS can use a closed voltage loop to track the envelope signal of an RF signal.

In an embodiment of the present invention, a VCVS is a linear VCVS, and one end of the VCVS is connected to the output end of a system. The output end feeds back an output voltage to the VCVS so that the VCVS can compare the output voltage fed back by the output end with the envelope signal of the received RF signal, thus controlling the output voltage of the VCVS. According to the preceding technology, in comparison with an envelope signal, the distortion degree of an output voltage signal of the VCVS is lower.

S420: Sample the output current of the VCVS to obtain a sampling signal.

Specifically, in an embodiment of the present invention, a sampling unit may be used for sampling. Specifically, a current sensor may be used to sample the output current of a VCVS.

S430: Perform the $n^{th}$ filtering on the sampling signal obtained in step S420 according to a predefined $n^{th}$ passband.

S440: Output the sampling signal after the $n^{th}$ filtering to an $n^{th}$ CCCS to control the output current of the $n^{th}$ CCCS.

It should be noted that the $n^{th}$ passband is lower than the $(n-1)^{th}$ passband. Specifically, in an embodiment of the present invention, N filtering units may be used to filter sampling signals sampled by a sampling unit. Thus, the passbands of the first filtering unit to the $N^{th}$ filtering unit are arranged in high-to-low sequence.

The switching frequency of the $n^{th}$ CCCS is higher than the switching frequency of the $(n-1)^{th}$ CCCS. That is, the switching frequencies of the first CCCS to the $N^{th}$ CCCS are arranged in high-to-low sequence.

In the embodiment of the present invention, N is an integer greater than or equal to 2, and n are all positive integers smaller than or equal to N.

In the embodiment of the present invention, various filtering units form a band allocation system of band stage matching so that various CCCSs work in different bands. The band stage matching is implemented by using CCCSs at different bandwidths, and the optimized configuration is performed for the output power and the bandwidth, thus supplying power to an RFPA.

It should be noted that in an embodiment of the present invention, in a band allocation system of band stage matching that includes multiple filtering units, the passband upper limit of each filtering unit may be set to a value that is slightly higher than the bandwidth upper limit of the corresponding CCCS, and the passband lower limit of each filtering unit may be set to a value that is slightly lower than the bandwidth upper limit of the next-level CCCS to ensure seamless band stage matching.

In the embodiment of the present invention, through the preceding technical solution, one linear power supply (namely, a VCVS) and at least two switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

Figure 12:
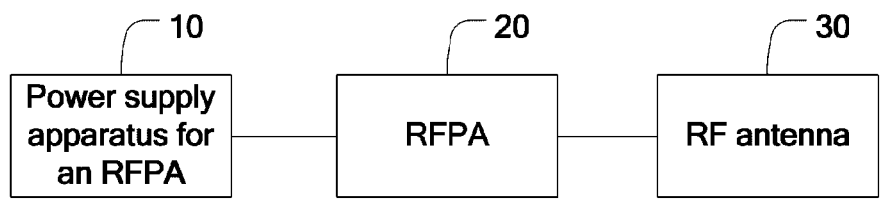
FIG. 12 shows a structure of a power supply system for an RFPA in an embodiment of the present invention.

As shown in FIG. 12, accordingly, an embodiment of the present invention provides a power supply system for an RFPA. The system includes any of the preceding power supply apparatuses 10 for an RFPA, an RFPA 20, and an RF antenna 30. The power supply apparatus 10 for an RFPA is configured to supply power to the RFPA 20. As a load of the power supply apparatus 10 for an RFPA, the RFPA 20 is configured to amplify input signals of the RFPA and output the amplified signals. The RF antenna 30 is configured to transmit output signals of the RFPA 20.

For details about the specific structure of any power supply apparatus 10 for an RFPA, see the preceding description.

In the embodiments of the present invention, through the preceding technical solution, one linear power supply (namely, a VCVS) and N (N is an integer greater than or equal to 2) switching power supplies (namely, CCCSs) are combined to supply power to an RFPA. The restriction of the prior art is broken. According to envelope signals at different bands, CCCSs at different power levels can be used to output power at the corresponding bands. Through a combination of multiple switching power supplies, the three conditions of high power, high bandwidth, and high efficiency can be met. In comparison with the prior art, the overall efficiency is improved.

It is understandable to those skilled in the art that all or part of the processes of the preceding embodiments can be implemented by hardware following instructions of computer programs. The programs may be stored in a computer readable storage medium. When being executed, the programs may include the processes of the preceding embodiments. The storage medium may be a magnetic disk, a compact disk, a read-only memory (ROM), or a random access memory (RAM).

The preceding describes only several embodiments of the present invention. Those skilled in the art can make various modifications and variations to the invention according to the application document without departing from the scope of the invention.

What is claimed is:

1. A power supply apparatus for a radio frequency power amplifier (RFPA), the power supply apparatus comprising:
   a voltage controlled voltage source (VCVS) configured to receive a radio frequency (RF) signal;
   N current controlled current sources (CCCSs), an output end of the VCVS is coupled to output ends of the N CCCSs in parallel;
   N sampling units and N filtering units, wherein N is an integer greater than or equal to 2, wherein the N sampling units and N filtering units comprise:
   a first sampling unit, configured to sample the output current of the VCVS to obtain a first sampling signal;
   a first filtering unit, configured to filter the first sampling signal obtained by the first sampling unit according to a predefined first passband and output the filtered first sampling signal to a first CCCS, thus controlling the output current of the first CCCS;

an $n^{th}$ sampling unit, configured to sample a sum of output currents of the first (n−1) CCCSs and the VCVS to obtain an $n^{th}$ sampling signal; and an $n^{th}$ filtering unit, configured to filter the $n^{th}$ sampling signal according to a predefined $n^{th}$ passband and output the filtered $n^{th}$ sampling signal to an $n^{th}$ CCCS, thus controlling an output current of the $n^{th}$ CCCS;

wherein the $n^{th}$ passband of the $n^{th}$ filtering unit is lower than an $(n-1)^{th}$ passband of an $(n-1)^{th}$ filtering unit, wherein a switching frequency of the $n^{th}$ CCCS is higher than a switching frequency of an $(n-1)^{th}$ CCCS; and wherein n is an integer greater than or equal to 2 and less than or equal to N.

2. The apparatus of claim 1, wherein the $n^{th}$ CCCS comprises:

a control module, configured to obtain a difference signal by subtracting a predefined reference from the $n^{th}$ sampling signal filtered by the $n^{th}$ filtering unit and generate a pulse signal by compensating and modulating the difference signal; and a power module, configured to control the output current of the $n^{th}$ CCCS according to a width of the pulse signal.

3. The apparatus of claim 1, wherein the $n^{th}$ sampling signal is a voltage signal.

4. The apparatus of claim 1, wherein the $n^{th}$ sampling signal is a current signal.

5. A power supply apparatus for a radio frequency power amplifier (RFPA), the apparatus comprising:

a voltage controlled voltage source (VCVS) configured to receive a radio frequency (RF) signal;

N current controlled current sources (CCCSs), an output end of the VCVS being coupled to output ends of the N CCCSs in parallel;

a sampling unit configured to sample an output current of the VCVS to obtain a sampling signal; and N filtering units, wherein N is an integer greater than or equal to 2, the N filtering units comprising:

a first filtering unit, configured to filter the sampling signal according to a predefined first passband and output the filtered sampling signal to a first CCCS, thus controlling an output current of the first CCCS; and an $n^{th}$ filtering unit, configured to filter the sampling signal according to a predefined $n^{th}$ passband and output the filtered sampling signal to an $n^{th}$ CCCS, thus controlling an output current of the $n^{th}$ CCCS;

wherein the $n^{th}$ passband of the $n^{th}$ filtering unit is lower than an $(n-1)^{th}$ passband of an $(n-1)^{th}$ filtering unit, wherein a switching frequency of the $n^{th}$ CCCS is higher than a switching frequency of an $(n-1)^{th}$ CCCS; and wherein n is an integer such that $2 \leq n \leq N$.

6. The apparatus of claim 5, wherein the $n^{th}$ CCCS comprises:

a control module, configured to obtain a difference signal by subtracting a predefined reference from the $n^{th}$ sampling signal filtered by the $n^{th}$ filtering unit and generate a pulse signal by compensating and modulating the difference signal; and a power module, configured to control the output current of the $n^{th}$ CCCS according to a width of the pulse signal.

7. The apparatus of claim 5, wherein the sampling signal is a voltage signal.

8. The apparatus of claim 5, wherein the sampling signal is a current signal.

9. A method for operating a radio frequency power amplifier (RFPA), wherein an output end of a voltage controlled voltage source (VCVS) that receives a radio frequency (RF) signal is coupled to output ends of N current controlled current sources (CCCSs) in parallel, wherein N is an integer greater than or equal to 2, the method comprising:

sampling an output current of the VCVS to obtain a first sampling signal;

filtering the first sampling signal according to a predefined first passband;

outputting the filtered first sampling signal to a first CCCS, thereby controlling the output current of the first CCCS;

sampling a sum of output currents of the first (n−1) CCCSs and the VCVS to obtain an $n^{th}$ sampling signal;

filtering the $n^{th}$ sampling signal according to a predefined $n^{th}$ passband; and outputting the filtered $n^{th}$ sampling signal to an $n^{th}$ CCCS, thereby controlling an output current of the $n^{th}$ CCCS;

wherein the $n^{th}$ passband is lower than an $(n-1)^{th}$ passband, wherein a switching frequency of the $n^{th}$ CCCS is higher than a switching frequency of an $(n-1)^{th}$ CCCS; and wherein n is an integer and $2 \leq n \leq N$.

10. The method of claim 9, wherein the $n^{th}$ sampling signal is a voltage signal.

11. The method of claim 9, wherein the $n^{th}$ sampling signal is a current signal.

12. A method for operating a radio frequency power amplifier (RFPA), wherein an output end of a voltage controlled voltage source (VCVS) that receives a radio frequency (RF) signal is coupled to output ends of N current controlled current sources (CCCSs) in parallel and N is an integer greater than or equal to 2, the method comprising:

sampling an output current of the VCVS to obtain a sampling signal, and filtering the sampling signal according to a predefined $n^{th}$ passband; and outputting the filtered sampling signal to an $n^{th}$ CCCS, thereby controlling an output current of the $n^{th}$ CCCS;

wherein the $n^{th}$ passband is lower than an $(n-1)^{th}$ passband, wherein a switching frequency of the $n^{th}$ CCCS is higher than a switching frequency of an $(n-1)^{th}$ CCCS; and wherein n is an integer less than or equal to N.

13. The method of claim 12, wherein the $n^{th}$ sampling signal is a voltage signal.

14. The method of claim 12, wherein the $n^{th}$ sampling signal is a current signal.

15. A power supply system comprising:

an RFPA;

a radio frequency (RF) antenna; and the power supply apparatus of claim 1, wherein the power supply apparatus is configured to supply power to the RFPA as a load of the power supply apparatus, wherein the RFPA is configured to amplify input signals of the RFPA and output the amplified signals; and wherein the RF antenna is configured to transmit the output signals of the RFPA.

16. The system of claim 15, wherein the $n^{th}$ sampling signal is a voltage signal.

17. The system of claim 15, wherein the $n^{th}$ sampling signal is a current signal.

18. A power supply system comprising:

an RFPA;

a radio frequency (RF) antenna; and the power supply apparatus of claim 5;

wherein the power supply apparatus is configured to supply power to the RFPA as a load of the power supply apparatus, wherein the RFPA is configured to amplify input signals of the RFPA and output the amplified signals; and wherein the RF antenna is configured to transmit the output signals of the RFPA.

19. The system of claim 18, wherein the sampling signal is a voltage signal.

20. The system of claim 18, wherein the sampling signal is a current signal.

* * * * *